United States Patent
Saha et al.

(10) Patent No.: US 7,872,478 B2
(45) Date of Patent: Jan. 18, 2011

(54) METHOD AND ADAPTIVE DISTANCE PROTECTION RELAY FOR POWER TRANSMISSION LINES

(75) Inventors: Murari Saha, Västerås (SE); Eugeniusz Rosolowski, Wroclaw (PL); Jan Izykowski, Wroclaw (PL)

(73) Assignee: ABB Technology Ltd., Zürich (CH)

( * ) Notice: Subject to any disclaimer, the term of this patent is extended or adjusted under 35 U.S.C. 154(b) by 334 days.

(21) Appl. No.: 12/279,030

(22) PCT Filed: Dec. 21, 2006

(86) PCT No.: PCT/EP2006/070082

§ 371 (c)(1),
(2), (4) Date: Aug. 11, 2008

(87) PCT Pub. No.: WO2007/090484

PCT Pub. Date: Aug. 16, 2007

(65) Prior Publication Data

US 2009/0021878 A1   Jan. 22, 2009

(30) Foreign Application Priority Data

Feb. 10, 2006   (SE)   .................................. 0600322

(51) Int. Cl.
*G01R 31/00* (2006.01)
*H02H 3/00* (2006.01)

(52) U.S. Cl. .................. 324/512; 324/500; 361/80
(58) Field of Classification Search ........... 324/500, 324/512; 361/80
See application file for complete search history.

(56) References Cited

U.S. PATENT DOCUMENTS 4,841,405 A    6/1989   Udren (Continued)

FOREIGN PATENT DOCUMENTS

EP   1168558 A2   1/2002

OTHER PUBLICATIONS

P.K. Dash et al; Application of Minimal Radial Basis Function Neural Network to Distance Protection; IEEE Transactions on Power Delivery, vol. 16, No. 1, Jan. 2001; pp. 68-74.

(Continued)

*Primary Examiner*—Jeff Natalini
*Assistant Examiner*—Farhana Hoque
(74) *Attorney, Agent, or Firm*—Venable LLP; Eric J. Franklin

(57) ABSTRACT

A method and an adaptive distance protection relay for compensating for a remote line end infeed effect during determination of a distance to a resistive fault on a three-phase power transmission line. It is assumed that a fault current flows through the fault resistance. A fault loop impedance is first calculated by a known algorithm from phase voltages and phase currents. A shift of the fault loop impedance is determined from the fault loop impedance, the impedance of the transmission line for the positive current sequence and the phase angle of a complex fault current distribution factor, where the fault current distribution factor is the ratio of the fault loop current to the fault current. The distance to fault is calculated by subtracting the impedance shift from the fault loop impedance and dividing the result by the impedance of the transmission line for the positive current sequence.

6 Claims, 1 Drawing Sheet

U.S. PATENT DOCUMENTS 5,839,093 A    11/1998   Novosel et al.
6,661,630 B1   12/2003   Ahn

OTHER PUBLICATIONS

P. K. Dash et al; Adaptive Relay Setting for Flexible AC Transmission Systems (FACTS); IEEE Transactions on Power Delivery, vol. 15, No. 1, Jan. 2000; pp. 38-43.

M. E. Erezzaghi et al; The Effect of High Resistance Faults on a Distance Relay; IEEE, 2003; pp. 2128-2133.

K. K. Li, et al; Stand Alone Intelligent Digital Distance Relay; IEEE Transactions on Power Systems, vol. 15, No. 1, Feb. 2000; pp. 137-142.

Wang Xiaoru et al; Applying Neural Networks in Adaptive Distance Protection; IEEE, 1998; pp. 1158-1162.

PCT/ISA/210—International Search Report—Mar. 27, 2007.

PCT/ISA/237—Written Opinion of The International Searching Authority—Mar. 27, 2007.

PCT/IPEA/409—International Preliminary Report on Patentability—Apr. 28, 2008.

METHOD AND ADAPTIVE DISTANCE PROTECTION RELAY FOR POWER TRANSMISSION LINES

CROSS-REFERENCE TO RELATED APPLICATIONS

This application claims priority to Swedish patent application 0600322-2 filed 10 Feb.2006 and is the national phase under 35 U.S.C. §371 of PCT/EP2006/070082 filed 21 Dec.2006.

TECHNICAL FIELD

This invention relates to a method and a device for an adaptive distance protection of power transmission lines and relates more particularly to a distance protection relay with improved operation under resistive faults, adapted to reduce under-reaching and overreaching of the relay, that is caused by a remote line end infeed effect.

BACKGROUND OF THE INVENTION

Power transmission lines carry electric power from generating sources to users. The power transmission lines are typically high voltage lines and the electric voltage is typically transformed to a lower voltage at a power substation, before being distributed to individual electric power users such as homes, factories, business buildings etc. At many power substations, protective relays are installed.

The detection of a fault in the line involves measuring critical system parameters and, when a fault occurs, quickly making a rough estimate of the fault location and of certain characteristics of the fault so that the faulted line can be isolated from the power grid as quickly as possible. A fault occurs when a transmission line, typically due to external causes, diverts electrical current flow from its normal path along the transmission line.

The major types and causes of faults are insulation faults, caused by design defects, manufacturing defects, improper installation, and aging insulation; electrical faults, caused by lightning surges, switching surges, and dynamic overvoltages; mechanical faults, caused by wind, snow, ice, contamination, trees, and animals; and thermal faults, caused by overcurrent and overvoltage conditions.

Power systems have, over time, been more complicated in construction, larger in size and higher in voltage, and associated protection systems have also become very complicated in construction. In this regard, provided that such a protection system cannot show its appropriate protection ability with respect to a fault occurring at some part of an associated power system, the resulting accident ripple range and strength will be very great.

If a protection relay bearing a primary responsibility does not accurately detect a fault occurring at any one part of a power system, a power interruption zone will be wider according to the rules of protection coordination. All backup protection relays for transmission lines and most main protection relays therefore are directional distance relays that are generally degraded in detection performance upon occurrence of a resistance earth fault. Further, as a transmission system becomes more complicated in construction, the average length of a trans-mission zone through which heavy load current flows is shortened, thereby causing a distance relay to perform a mal-operation or non operation due to a reactance effect which is a mutual coupling effect of a fault resistance and load current.

A transmission line may include three-phase lines; however, a transmission line may also contain one phase, or some other number of phases.

PRIOR ART

The issue of locating faults on power transmission lines has been disclosed in different prior art.

In A. Wiszniewski, *Accurate fault impedance locating algorithm*, IEE Proceedings, Part C, Vol. 130, No. 6, 1983, pp. 311-315 an algorithm for locating faults on power transmission lines for the inspection-repair purpose, and thus not for protective relaying, has been presented. For all fault types the total fault current, i.e. the current flowing through a fault path resistance is estimated with use of the 'pure line current' at the fault locator installation point. This 'pure line current', or in other words the 'incremental line current', is determined as the difference of the post-fault line current and the load current. Moreover, this measured 'incremental line current' is considered for particular phases, depending on the type of a fault.

In M. M. Saha, Method and device for locating a fault point on a three-phase power transmission line, U.S. Pat. No. 4,559,491, Dec. 17, 1985, an algorithm for locating faults on a power transmission line for the inspection-repair purpose, and thus not for protective relaying, has been presented. The distance to fault is calculated with use of the quadratic equation, which is suitable for the off-line fault location purpose and rather difficult for on-line application to protective relaying.

In Zhang et. al, *An adaptive approach in digital distance protection*, IEEE Transactions on Power Delivery, Vol. 6, No. 1, January 1991, pp 135-142, an adaptive approach to distance protection of a transmission line has been disclosed. The approach deals only with single-phase-to-ground faults, while the invention deals with all fault types. For the single-phase-to-ground faults considered, the total fault current is estimated with use of the zero sequence current. The authors propose to use a pre-set value for the adaptive change of operating characteristics of the distance protection. This pre-set value corresponds to a fault at the end of the relay nominal reach which is determined under the simplifications. However, if the remote-end and local zero-sequence contributions are out of phase, an error in the dynamic response would occur.

In D. Novosel, Yi Hu, M. M. Saha, Adaptive Distance protection system, U.S. Pat. No. 5,956,220, Sep. 21, 1991, an adaptive distance protection system has been introduced. This adaptive system is designed to compensate correctly for mutual coupling effects. Thus, it deals with specific problems for parallel transmission lines under single-phase-to-ground faults and with taking into account different operation modes of the healthy parallel line, where the operation modes are being in operation or switched-off and grounded. These specific problems for parallel transmission lines have no relation to the presented invention.

In L. Yang, Adaptive Quadrilateral Characteristic Distance Relay, U.S. Pat. No. 5,796,258, Aug. 18, 1998, an adaptive quadrilateral characteristic distance relay has been presented. The tilt of the quadrilateral characteristic is determined using the negative sequence current for a single-phase-to-ground fault and the pure line currents from the respective phases at the relaying point, i.e. the incremental currents understood as the differences between the fault and the load currents, for inter-phase faults. The distance to fault and impedance parameters of the network are not present in the equations.

This means that the method is simplified and does not consider compensation of the remote end infeed effect accurately.

In Yong Jin Ahn, Distance Relay for protection of transmission line having minimized reactance effect, U.S. Pat. No. 6,661,630, Dec. 9, 2003, a distance relay for protection of a transmission line having minimized reactance effect has been presented. It considers both the single and parallel line cases. The single-phase-to-ground as well as inter-phase faults are taken into account. The total fault current is estimated using the zero sequence current for single-phase-to-ground faults, and using the pure line currents from the respective phases at the relaying point for inter-phase faults. Incremental currents are understood as the difference between the fault and the load currents. This means that the procedure of estimation of the total fault current is entirely different than in the invention. Also the fault current distribution factors are utilized. Compensation for the remote end infeed effect is performed using iterative calculations with the starting point being determined under the assumption that the angle of the fault current distribution factor is equal to zero. It is worth to notice that performing iterative calculations for the on-line application of protection is rather difficult and in certain conditions the convergence of iterative calculations is not obtained.

In J. Izykowski, E. Rosolowski, M. M. Saha, *Locating faults in parallel transmission lines under availability of complete measurements at one end*, IEE Generation, Transmission and Distribution, Vol. 151, No. 2, March 2004, pp. 268-273, a fault location algorithm designed for application to parallel transmission lines under availability of complete measurements at one end has been delivered. Complete measurements are understood as three-phase voltages and three phase currents from both faulted and parallel healthy line. Similarly as in the invention the total fault current is estimated with avoiding the zero sequence quantities. Due to availability of complete measurements at one end, the final fault location algorithm is of very simple form. The invention is not related to the availability of measurements considered in the reference, since a rather standard availability of measurements is considered in the invention.

In J. Izykowski, E. Rosolowski, M. M. Saha, *Adaptive digital distance algorithm for parallel transmission lines*, 2003 IEEE Power Tech, Bolonia, Jun. 23-26, 2003, CD Rom, IEEE Catalogue Number 03EX719C, ISBN 0-7803-7968-3, paper 343, pp. 6, further investigation of the method from the above reference is performed. In particular, due to a very simple first order equation for a distance to fault, its application to adaptive distance protection is considered. As described above the availability of complete measurements at one end of parallel transmission lines is different from the situation assumed with respect to the present invention.

SUMMARY OF THE INVENTION

The object of the present invention is to solve the problems related to known methods and prior art and to create an improved, simple and reliable method and device for an adaptive distance protection of three-phase power transmission lines.

A further object is to improve the operation under resistive faults and by reducing underreaching and overreaching of the relay which is caused by a remote line end infeed effect.

The method is performed by the distance protection relay in case of a resistive fault on a three-phase transmission line, when a fault current $\underline{I}_F$ flows through the fault resistance $R_F$. The method starts with the step, known in the art, to calculate a fault loop impedance $\underline{Z}_{relay}$ by dividing a fault loop voltage $\underline{V}_{relay}$ by a fault loop current $\underline{I}_{relay}$ measured from one end A of the transmission line AB, which is the end where the distance protection relay is arranged. The fault loop voltage $\underline{V}_{relay}$ is composed of the respective phase voltages $\underline{V}_{ph1}$, $\underline{V}_{ph2}$, $\underline{V}_{ph3}$ and the fault loop current $\underline{I}_{relay}$ is composed of the respective phase currents $\underline{I}_{ph1}$, $\underline{I}_{ph2}$, $\underline{I}_{ph3}$ of those phases which are involved in the fault.

The method according to the invention comprises the step of determining a shift $\Delta\underline{Z}$ of the fault loop impedance using the fault loop impedance $\underline{Z}_{relay}$, the impedance $\underline{Z}_{1L}$ of the transmission line for the positive current sequence and the phase angle $\gamma$ of a complex fault current distribution factor $\underline{k}_F$, according to the equation $$\Delta\underline{Z} = \frac{R_{relay}X_{1L} - R_{1L}X_{relay}}{R_{1L}tg(\gamma) + X_{1L}}(1 - j \cdot tg(\gamma)),$$

where $\underline{Z}_{relay}=R_{relay}+jX_{relay}$, $\underline{Z}_{1L}=R_{1L}+jX_{1L}$ and where the fault current distribution factor $\underline{k}_F$ is the ratio of the fault loop current $\underline{I}_{relay}$ to the fault current $\underline{I}_F$.

The next step of the method according to the invention is to determine a distance to fault d by subtracting the impedance shift $\Delta\underline{Z}$ from the fault loop impedance $\underline{Z}_{relay}$ and dividing the result by the impedance $\underline{Z}_{1L}$ of the transmission line for the positive current sequence.

The determination of the fault loop impedance $\underline{Z}_{relay}$ only from phase voltages and currents measured at the relay side A is not a direct measure of the distance to fault d in case of a resistive fault. In that case, the fault current $\underline{I}_F$ flowing through the fault resistance $R_F$ has to be considered, where the fault current can not be determined from the relay side A alone. The phase currents coming from the remote end B of the line have to be regarded as well, since they feed the fault from the remote end B. This effect is called remote line end infeed effect. If the influence of the fault current $\underline{I}_F$ is neglected in such a resistive fault case, a wrong distance to fault d is determined which might lead to overreaching or underreaching of the distance protection relay.

According to the invention, the fault loop impedance $\underline{Z}_{relay}$ is adapted by shifting it in the complex plane along the impedance shift $\Delta\underline{Z}$, which represents the influence of the fault current $\underline{I}_F$ by taking into account the phase angle $\gamma$ of the fault current distribution factor $\underline{k}_F$. Thereby, the method and the adaptive distance protection relay according to the invention compensate for the remote line end infeed effect and increase the accuracy of the determined distance to fault d.

For calculation of the phase angle $\gamma$, three different possibilities are proposed.

In the simplest case, the phase angle $\gamma$ of the fault current distribution factor $\underline{k}_F$ is assumed to be zero, i.e. it is assumed that only a resistive shift of the fault loop impedance $\underline{Z}_{relay}$ needs to be performed:

$$\Delta\underline{Z}(\gamma = 0) = \left(R_{relay} - \frac{X_{relay}}{X_{1L}}R_{1L}\right).$$

In case that the distance protection relay on side A of the line is also able to receive synchronized current measurements from the remote side B, the phase angle $\gamma$ is calculated from the fault loop current $\underline{I}_{relay}$ and the fault current $\underline{I}_F$, where the fault current $\underline{I}_F$ is determined in case of a phase-to-ground, a phase-to-phase or a three-phase-balanced fault using the incremental positive sequence current components $\Delta \underline{I}_{A1}$ and $\Delta \underline{I}_{B1}$ of both ends of the transmission line, or in case of a phase-to-phase-to-ground fault using the incremental positive sequence current components $\Delta \underline{I}_{A1}$ and $\Delta \underline{I}_{B1}$ as well as the negative sequence current components $\underline{I}_{A2}$ and $\underline{I}_{B2}$ of both ends of the transmission line.

In the case that only current measurements from the relay side A are to be used, the phase angle $\gamma$ is calculated three times, each time from the fault loop current $\underline{I}_{relay}$, the fault current $\underline{I}_F$ and one of three different, predetermined line distances $d_i$, where the fault current $\underline{I}_F$ is determined in case of a phase-to-ground or a phase-to-phase fault using impedance parameters of the transmission line, the fault loop current $\underline{I}_{relay}$ and the negative sequence current component $\underline{I}_{A2}$ of the relay end A of the transmission line, or in case of a three-phase or a phase-to-phase-to-ground fault using additionally the incremental positive sequence current component $\Delta \underline{I}_{A1}$ of the relay end A of the transmission line, and where the three resulting phase angles $\gamma_7$ are used to determine three impedance shifts $\Delta \underline{Z}_i$ and three corresponding possible distances to fault $d_{pi}$, where the one of the three possible distances to fault $d_{pi}$ which lies closest to a reference distance to fault $d_{ref}$, which is calculated as the quotient of the fault loop impedance $\underline{Z}_{relay}$ and the impedance of the transmission line for the positive current sequence $\underline{Z}_{1L}$, is chosen as the distance to fault d.

The invention provides a new digital distance algorithm for both single and parallel power transmission lines. In case of parallel lines, the third solution can be applied which requires providing standard measurements from one end of the parallel lines. An approach which originates initially from fault location aimed at inspection-repair purposes was enhanced to be utilized here for assuring adaptability of a distance relay to the "reactance effect" which is relevant for resistive faults. An improved estimation of the voltage drop across the fault path resistance $R_F$ is introduced into the algorithm. As a result of that, determination of the zero sequence currents is avoided and the incremental positive sequence component and the negative sequence component are utilized. In that the provided method differs from known algorithms. The method according to the invention has been tested with the fault data obtained from simulations performed using the known ATP-EMTP software.

According to the invention, the total fault current is estimated using the generalized fault model formulated for the sequence quantities. This approach based on sequence quantities is utilized in order to avoid an adverse influence of uncertainty with respect to the zero sequence line impedance parameter, which additionally causes that an estimation of the total fault current is identical for both the single and parallel lines, using the incremental positive sequence current for the majority of faults, i.e. single-phase to ground faults and phase-to-phase faults.

In comparison with the prior art of Yong Jin Ahn, the iterative calculations used there are avoided in the current invention by determining the total fault current from either two-end synchronized measurements of currents or alternatively by using three specific impedance shifts of the impedance characteristic, for example the MHO characteristic.

BRIEF DESCRIPTION OF THE DRAWINGS

For better understanding of the present invention, reference is made to the figures below.

DESCRIPTION OF THE INVENTION AND ITS EMBODIMENTS

Remote End Infeed Influence on Distance Relay Operation

Figure 1:
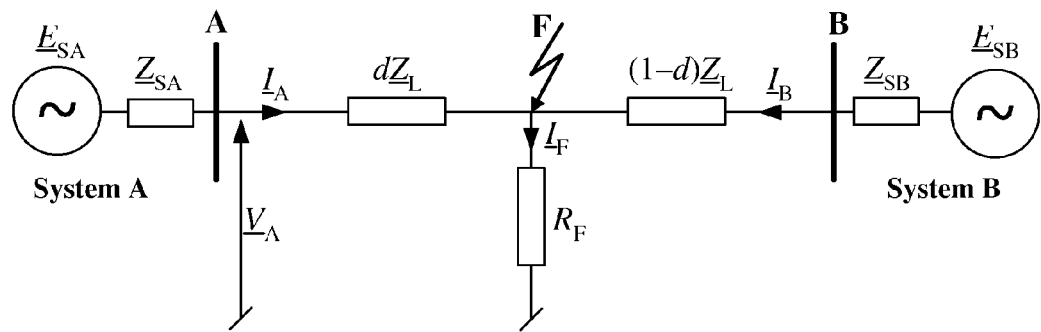
FIG. 1 illustrates a two end transmission line AB.

The following explanations relate to the relay A, arranged at the respective position A in the transmission line depicted in FIG. 1.

According to standard typical distance protection, a fault loop impedance $\underline{Z}_{relay}$ is determined from a fault loop voltage $\underline{V}_{relay}$ and a fault loop current $\underline{I}_{relay}$, both composed, according to the current fault type, of measurements of phase voltages or currents, respectively, taken by relay A (see Table 1):

$$Z_{\text{relay}} = \frac{V_{\text{relay}}}{I_{\text{relay}}} = R_{relay} + jX_{relay} \qquad (1)$$

TABLE 1

Composition of relaying signals for different fault types

| Fault type | Relaying voltage, current |
|---|---|
| ph-g | $\underline{V}_{relay} = \underline{V}_{ph}$, $\underline{I}_{relay} = \underline{I}_{ph} + \underline{k}_0 \underline{I}_0 + \underline{k}_{0m} \underline{I}_{parallel\_0}$ |
| ph1-ph2, ph1-ph2-g, ph1-ph2-ph3, ph1-ph2-ph3-g | $\underline{V}_{relay} = \underline{V}_{ph1} - \underline{V}_{ph2}$, $\underline{I}_{relay} = \underline{I}_{ph1} - \underline{I}_{ph2}$ | where ph, ph1, ph2, g are subscripts for indicating faulted phases or ground, respectively;

$\underline{I}_0$, $\underline{I}_{parallel\_0}$ are the zero sequence current of the faulted or the healthy parallel line, respectively;

$$\underline{k}_0 = \frac{Z_{0L} - Z_{1L}}{Z_{1L}};$$

$$\underline{k}_{0m} = \frac{Z_{0m}}{Z_{1L}} \text{ in case of a single line: } \underline{k}_{0m} = 0;$$

$\underline{Z}_{1L}, \underline{Z}_{0L}, \underline{Z}_{0m}$ are the line impedances for positive, zero and mutual zero sequences, respectively.

If there is a solid fault, i.e. a fault not involving a fault resistance so that $R_F \approx 0$ applies, then the determined fault loop impedance $\underline{Z}_{relay}$ according to equation (1) is a direct measure of the distance to fault d, where d is preferably given in p.u.:

$$\underline{Z}_{relay} = d \cdot \underline{Z}_{1L} \text{ if: } R_F \approx 0 \qquad (2),$$

where:

$\underline{Z}_{1L} = R_{1L} + jX_{1L}$ is the impedance of the line AB of FIG. 1 for the positive sequence.

In case of resistive faults, i.e. faults involving a fault resistance of not negligible value so that $R_F \neq 0$ applies, the determined fault loop impedance $\underline{Z}_{relay}$ according to equation (1) is no longer a direct measure of the distance to fault d. The equation (2) is not applicable here. Instead the fault loop is described as follows:

$$\underline{V}_{relay} - d \cdot \underline{Z}_{1L}\underline{I}_{relay} - R_F\underline{I}_F = 0 \qquad (3)$$

where:

$\underline{I}_F$ is the total fault current, also called fault path current, which results from the current $\underline{I}_A$, flowing from the relaying point A, and also from the current $\underline{I}_B$, feeding the fault from the remote end B, see FIG. 1.

Dividing both sides of equation (3) by the relaying current $\underline{I}_{relay}$ one obtains the following impedance equation:

$$\underline{Z}_{relay} - d \cdot \underline{Z}_{1L} - R_F\left(\frac{\underline{I}_F}{\underline{I}_{relay}}\right) = 0, \qquad (4)$$

or in the alternative form:

$$\underline{Z}_{relay} - d \cdot \underline{Z}_{1L} - \Delta\underline{Z} = 0 \qquad (5)$$

where:

$\Delta\underline{Z}$ is the impedance shift resulting from the remote end infeed effect which is caused by the resistive fault.

Introducing the fault current distribution factor $\underline{k}_F$ as the following ratio:

$$\underline{k}_F = \frac{\underline{I}_{relay}}{\underline{I}_F}, \qquad (6)$$

the equation (4) can be written as:

$$\underline{Z}_{relay} - d \cdot \underline{Z}_{1L} - \frac{R_F}{\underline{k}_F} = 0. \qquad (7)$$

Substitution of the fault current distribution factor $\underline{k}_F$ by its polar form into equation (7) results in:

$$\underline{Z}_{relay} - d \cdot \underline{Z}_{1L} - \frac{R_F}{k_F \cdot e^{j\gamma}} = 0, \qquad (8)$$

where:

$k_F$ is the magnitude of the fault current distribution factor, $k_F = |\underline{k}_F|$, and $\gamma$ is the angle of the fault current distribution factor, $\gamma = \text{angle}(\underline{k}_F)$.

The alternative form of equation (8) is as follows:

$$\underline{Z}_{relay} - d \cdot \underline{Z}_{1L} - \left(\frac{R_F}{k_F}\right) \cdot (\cos(\gamma) - j\sin(\gamma)) = 0. \qquad (9)$$

Taking into account that the term $$\left(\frac{R_F}{k_F}\right)$$

is a real number, which is so since both, fault resistance $R_F$ and magnitude of the fault current distribution factor $k_F$ are real numbers, the equation (9) can be resolved into the real and imaginary parts:

$$R_{relay} - d \cdot R_{1L} - \left(\frac{R_F}{k_F}\right) \cdot \cos(\gamma) = 0, \qquad (10)$$

$$X_{relay} - d \cdot X_{1L} + \left(\frac{R_F}{k_F}\right) \cdot \sin(\gamma) = 0. \qquad (11)$$

Equation (10) can then be multiplied by $\sin(\gamma)$ and equation (11) by $\cos(\gamma)$. The results are then added while cancelling the term $$\left(\frac{R_F}{k_F}\right).$$

As a result of that a distance to fault d can be determined according to the following simple equation:

$$d = \frac{R_{relay} \cdot \sin(\gamma) + X_{relay} \cdot \cos(\gamma)}{R_{1L} \cdot \sin(\gamma) + X_{1L} \cdot \cos(\gamma)}. \qquad (12)$$

The obtained equation (12) is used for determining the compensation for the remote end infeed effect, which can cause under-reaching and/or over-reaching of distance relays under faults close to the border of the first protection zone and which can also slow down the tripping of the distance relays. In order to overcome these features of traditional distance relays it is proposed to compensate for the remote end infeed effect.

Method of Compensation for the Remote End Infeed Effect

Figure 2:
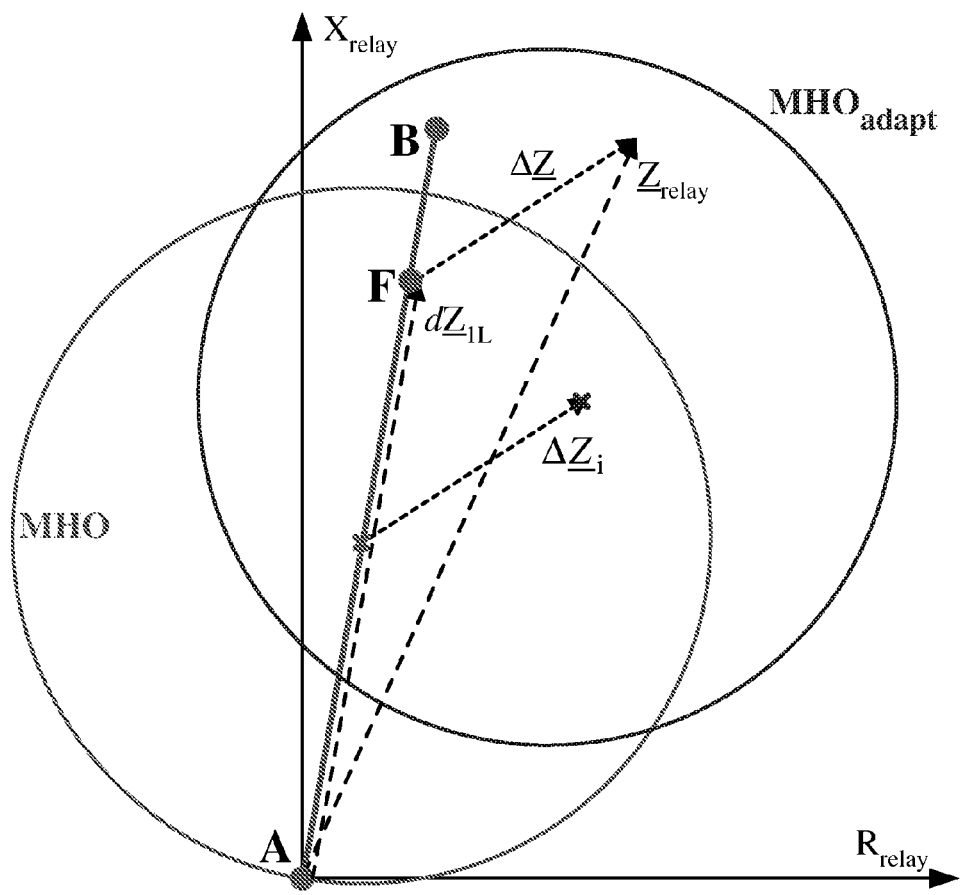
FIG. 2 illustrates an adaptive shift of MHO impedance characteristic of distance protection of transmission line AB.

In the proposed adaptive distance protection, an adaptation to the remote end infeed effect is introduced. The innovative idea is further presented in relation to the MHO impedance characteristic of the distance relay, where the MHO impedance characteristic as such is generally known and is represented by a circle in the R/X diagram whose circumference passes through the origin, as illustrated in FIG. 2. However, this method can also be used for other shapes of the impedance characteristic of the distance relay.

In the proposed adaptive distance relay the traditional way of computing the fault loop impedance $\underline{Z}_{relay}$ according to equation (1) is kept. The innovation lies in that the determined fault loop impedance $\underline{Z}_{relay}$ is compared with the impedance characteristic MHO$_{adapt}$, see FIG. 2, which is obtained by shifting the original characteristic MHO by the specific shift impedance, which according to equation (5) can be expressed as:

$$\Delta\underline{Z} = \Delta R + j\Delta X = \underline{Z}_{relay} - d\underline{Z}_{1L} \qquad (13).$$

The equation (13) can also be rewritten in the form:

$$\Delta\underline{Z} = \Delta R + j\Delta X = (R_{relay} - dR_{1L}) + j(X_{relay} - dX_{1L}) \qquad (14).$$

Substituting equation (12) into equation (14) results in the shift of the characteristic for the resistance:

$$\Delta R = R_{relay} - dR_{1L} \qquad (15)$$

-continued $$= R_{relay} - \frac{R_{relay}\sin(\gamma) + X_{relay}\cos(\gamma)}{R_{1L}\sin(\gamma) + X_{1L}\cos(\gamma)} R_{1L}$$

$$= \frac{R_{relay}X_{1L} - R_{1L}X_{relay}}{R_{1L}tg(\gamma) + X_{1L}}$$

and for the reactance:

$$\Delta X = X_{relay} - dX_{1L} = X_{relay} - \frac{R_{relay}\sin(\gamma) + X_{relay}\cos(\gamma)}{R_{1L}\sin(\gamma) + X_{1L}\cos(\gamma)} X_{1L} \quad (16)$$

$$\Delta X = \frac{-(R_{relay}X_{1L} - R_{1L}X_{relay})}{R_{1L}tg(\gamma) + X_{1L}} tg(\gamma).$$

Taking into account equations (15) and (16), the required impedance shift of the original impedance characteristic MHO for obtaining the adaptive characteristic $MHO_{adapt}$ equals:

$$\Delta \underline{Z} = \frac{R_{relay}X_{1L} - R_{1L}X_{relay}}{R_{1L}tg(\gamma) + X_{1L}} (1 - j \cdot tg(\gamma)). \quad (17)$$

This means that the required impedance shift (17) is determined by:
the resistance $R_{1L}$ and the reactance $X_{1L}$ of the line for the positive sequence,
the fault loop resistance $R_{relay}$ and the fault loop reactance $X_{relay}$ measured by the relay,
the angle $\gamma$ of the fault current distribution factor $\underline{k}_F$.

The value of $tg(\gamma)$ is not known since it is determined by the equation (6) in which the total fault current $\underline{I}_F$ is involved and this total fault current $\underline{I}_F$ is not measurable using only local measurements.

The simplest way of compensating for the remote infeed effect can be performed by assuming zero for the angle $\gamma$ of the fault current distribution factor $\underline{k}_F$, which results in $tg(\gamma)=0$. In this case the required shift of the impedance characteristic equals:

$$\Delta \underline{Z}(\gamma = 0) = \left(R_{relay} - \frac{X_{relay}}{X_{1L}} R_{1L}\right) + j \cdot 0. \quad (18)$$

This means that if the simplification $tg(\gamma)=0$ can be assumed, i.e. if the angle $\gamma$ of the fault current distribution factor $\underline{k}_F$ is approximately zero, then the impedance characteristic MHO of the distance relay is to be shifted only for the resistance as determined in equation (18) in order to compensate for the remote infeed effect.

In general, i.e. without assuming the simplification $tg(\gamma)=0$, the value of $tg(\gamma)$ has to be determined in order to substitute it into equation (17):

$$tg(\gamma) = \frac{imag(\underline{k}_F)}{real(\underline{k}_F)} \quad (19)$$

where: $\underline{k}_F = \frac{\underline{I}_{relay}}{\underline{I}_F}$ and $\gamma = angle(\underline{k}_F)$.

A total fault current $\underline{I}_F$ is composed of the currents flowing to the fault point F from both sides of the line (see FIG. 1):

$$\underline{I}_F = \underline{I}_A + \underline{I}_B \quad (20).$$

In case of providing the synchronized measurements at both sides of the line and high speed of communication between the line ends for transmitting the remote current to the distance relay, the total fault current according to equation (20) can be simply determined and then $tg(\gamma)$ from equation (19) is calculated. This allows determination of the required impedance shift of the impedance characteristic (17), applied for compensation for the remote end infeed effect.

The equation (20) indicates that the total fault current $\underline{I}_F$ can be determined with use of currents measured synchronously at both ends of the transmission line. Such measurements are performed for use by a differential relay. Since both a differential relay and a distance relays are together in modern protection terminals for power transmission lines, these measurements, i.e. currents measured synchronously at both ends of the transmission line, can be easily utilized also for performing an adaptive distance protection. This is a subject of the present invention. However, the solution proposed here is not a direct application of the equation (20).

When considering the application of synchronized two-end measurements of currents for determining the total fault current $\underline{I}_F$, it is worth noting that equation (20) is valid under neglecting shunt capacitances of the transmission line. In case of lines of length exceeding some threshold value, which can be for example 150 km, neglecting of shunt capacitances can be a cause of unacceptable errors in determining the total fault current according to equation (20). Therefore, in order to minimize an influence of shunt capacitances on determination of the total fault current $\underline{I}_F$, i.e. the current flowing through the fault path resistance $R_F$, a specific determination of this current is proposed. Instead of direct use of the equation (20) in which the currents of faulted phases from both ends are summed, the total fault current $\underline{I}_F$ is determined after resolving three phase currents from both ends into their symmetrical components and then after using the advantageous ones. Advantageous are those which minimize the shunt capacitances effect.

Basics of the Determination of the Total Fault Current $\underline{I}_F$

It is proposed to utilize the generalized fault model in the form of the following equation for determining the total fault current $\underline{I}_F$:

$$\underline{I}_F = \underline{a}_{F1}\underline{I}_{F1} + \underline{a}_{F2}\underline{I}_{F2} + \underline{a}_{F0}\underline{I}_{F0} \quad (21)$$

where:

$\underline{I}_{1F}, \underline{I}_{F2}, \underline{I}_{F0}$ are the symmetrical components of the total fault current and where the second subscript denotes the following: 1 the positive, 2 the negative and 0 the zero sequence, respectively;

$\underline{a}_{F1}, \underline{a}_{F2}, \underline{a}_{F0}$ are the share coefficients, dependent on the fault type according to Tables 1, 2 and 3.

The particular sequence components of the total fault current $\underline{I}_F$ are determined by adding up the respective sequence components of currents from the line terminals. At the right-hand side of the equations below, the first subscript denotes the terminal A or B, while the second subscript denotes the sequence component, with 1 for the positive, 2 for the negative and 0 for the zero sequence component:

$$\underline{I}_{F1} = \underline{I}_{A1} + \underline{I}_{B1} \quad (22),$$

$$\underline{I}_{F2} = \underline{I}_{A2} + \underline{I}_{B2} \quad (23),$$

$$\underline{I}_{F0} = \underline{I}_{A0} + \underline{I}_{B0} \quad (24).$$

Alternatively, the positive sequence component $\underline{I}_{F1}$ of the total fault current $\underline{I}_F$ can be determined using the superimposed incremental positive sequence currents $\Delta\underline{I}_{A1}$ and $\Delta\underline{I}_{B1}$, where the term incremental denotes the subtraction of the pre-fault values from the post-fault values:

$$\underline{I}_{F1} = \Delta\underline{I}_{A1} + \Delta\underline{I}_{B1} \quad (25).$$

It is known that the use of the positive sequence currents $\underline{I}_{A1}$ and $\underline{I}_{B1}$ from the line terminals, according to equation (22), for determining the total fault current $\underline{I}_F$ according to equation (21) is affected by the pre-fault load flow. Therefore, in the cases where the positive sequence currents $\underline{I}_{A1}$ and $\underline{I}_{B1}$ are used, the fault location accuracy is deteriorated, especially significantly if a high fault resistance is involved. In contrast, using the negative and the zero and the superimposed positive sequence components, according to equations (23) to (25), is advantageous for assuring high accuracy for determining the total fault current $\underline{I}_F$. As a result of that, the following priority for usage of the particular sequence components of the measured currents is proposed:

for phase-to-ground and phase-to-phase faults:
  superimposed positive sequence components $\Delta\underline{I}_{A1}$ and $\Delta\underline{I}_{B1}$ using Table 2,
for phase-to-phase-to-ground faults:
  superimposed positive sequence components $\Delta\underline{I}_{A1}$ and $\Delta\underline{I}_{B1}$ and negative sequence components $\underline{I}_{A2}$ and $\underline{I}_{B2}$ using Table 3,
for three-phase symmetrical faults:
  superimposed positive sequence components $\Delta\underline{I}_{A1}$ and $\Delta\underline{I}_{B1}$ using Table 4.

Determination of the Total Fault Current $\underline{I}_F$ for Phase-to-Ground and Phase-to-Phase Faults The share coefficients $\underline{a}_{F1}$, $\underline{a}_{F2}$ and $\underline{a}_{F0}$ from equation (21) can be determined by considering the boundary conditions of the faults considered in this section, which are phase-to-ground and phase-to-phase faults. However, there is a certain freedom in that. Among many possibilities, the share coefficients for the negative and zero sequence are chosen as $\underline{a}_{F2} = \underline{a}_{F0} = 0$, see Table 2. This assures that only the superimposed positive sequence components $\Delta\underline{I}_{A1}$ and $\Delta\underline{I}_{B1}$ are used for determining the total fault current $\underline{I}_F$:

$$\underline{I}_F = \underline{a}_{F1}\underline{I}_{F1} \quad (26)$$

where: $\underline{a}_{F1}$ is set according to Table 2, $\underline{I}_{F1}$ is determined according to equation (25).

TABLE 2

Phase-to-ground and phase-to-phase faults - recommended set of share coefficients.

| FAULT | $a_{F1}$ | $a_{F2}$ | $a_{F0}$ |
|---|---|---|---|
| a-g | 3 | 0 | 0 |
| b-g | $3a^2$ | 0 | 0 |
| c-g | $3a$ | 0 | 0 |
| a-b | $1-a^2$ | 0 | 0 |
| b-c | $a^2-a$ | 0 | 0 |
| c-a | $a-1$ | 0 | 0 |

TABLE 2-continued

Phase-to-ground and phase-to-phase faults - recommended set of share coefficients.

| FAULT | $a_{F1}$ | $a_{F2}$ | $a_{F0}$ |
|---|---|---|---|

$a = \exp(j2\pi/3); j = \sqrt{-1}$

Determination of the Total Fault Current $\underline{I}_F$ for Phase-to-Phase-to-Ground Faults In the case ph1-ph2-g fault, where ph1 and ph2 each denote one of the phases a, b or c, the total fault current $\underline{I}_F$ which flows in the considered inter-phase fault loop is equal to the difference of the phase fault currents $\underline{I}_{F\_ph1}$ and $\underline{I}_{F\_ph2}$ at the fault point F of the faulted phases ph1 and ph2:

$$\underline{I}_F = \underline{I}_{F\_ph1} - \underline{I}_{F\_ph2} \quad (27).$$

Resolving equation (27) into symmetrical components and considering the recommended priority for usage of the particular sequence components, i.e. using superimposed positive sequence components and negative sequence components, one obtains:

$$\underline{I}_F = \underline{a}_{F1}\underline{I}_{F1} + \underline{a}_{F2}\underline{I}_{F2} + \underline{a}_{F0}\underline{I}_{F0} \quad (28),$$

where the share coefficients are:

$\underline{a}_{F1}$ as in Table 3, $\underline{a}_{F2}$ as in Table 2, $\underline{a}_{F0} = 0$, and where $\underline{I}_{F1}$ is defined by equation (25) and $\underline{I}_{F2}$ by equation (23).

TABLE 3

Phase-to-phase-to-ground faults - recommended set of share coefficients.

| FAULT | $a_{F1}$ | $a_{F2}$ | $a_{F0}$ |
|---|---|---|---|
| a-b-g | $1-a^2$ | $1-a$ | 0 |
| b-c-g | $a^2-a$ | $a-a^2$ | 0 |
| c-a-g | $a-1$ | $a^2-1$ | 0 |

Determination of the Total Fault Current $\underline{I}_F$ for Three-Phase Balanced Faults In case of three-phase balanced faults, the respective phase-to-phase fault loop, which is usually the 'a-b' loop, is considered. In consequence of that, the share coefficient for the zero sequence $\underline{a}_{F0}$ equals to zero, $\underline{a}_{F0} = 0$. For the negative sequence, a non-zero share coefficient $\underline{a}_{F2}$ is obtained as given in Table 4. However, due to lack of negative sequence components, which is applicable for the three-phase balanced faults, the value of this coefficient is not important, i.e. it can be assumed as being equal to zero. So, finally the total fault current $\underline{I}_F$ for three-phase balanced faults is equal to:

$$\underline{I}_F = \underline{a}_{F1}\underline{I}_{F1} + \underline{a}_{F2}\underline{I}_{F2} + \underline{a}_{F0}\underline{I}_{F0} \quad (29),$$

where the resultant coefficients are:

$\underline{a}_{F1} = 1 - \underline{a}^2$, $\underline{a}_{F2} = 0$, and $\underline{a}_{F0} = 0$ and where $\underline{I}_{F1}$ is defined by equation (25).

TABLE 4

Three-phase balanced faults - set of recommended share coefficients.

| Fault | $a_{F1}$ | $a_{F2}$)* | $a_{F0}$ |
|---|---|---|---|
| a-b-c, a-b-c-g | $1-a^2$ | $1-a$ | 0 |

)*due to lack of negative sequence components under the balanced faults this coefficient can be assumed as equal to zero An alternative way of determining the value of tg(γ) from equation (19) is shown in the following.

An alternative way of determining the value of tg(γ) relies on considering the fault current distribution factor $\underline{k}_F$ and calculating tg(γ) as the ratio of the imaginary and the real parts of this factor:

$$tg(\gamma) = \frac{imag(\underline{k}_F(d))}{real(\underline{k}_F(d))}. \qquad (30)$$

The fault current distribution factor $\underline{k}_F$ can be expressed as follows:

$$\underline{k}_F(d) = \frac{l_{relay}}{a_{F1}I_{F1} + a_{F2}I_{F2}} \qquad (31)$$

$$= \frac{l_{relay}}{a_{F1}\frac{M_1}{K_1 d + L_1}\Delta I_{A1} + a_{F2}\frac{M_1}{K_1 d + L_1}I_{A2}}$$

where:

$\Delta \underline{I}_{A1}$, $\underline{I}_{A2}$ are the incremental positive and the negative sequence component of the currents at the relay point A, $\underline{M}_1 = \underline{Z}_{1SA} + \underline{Z}_{1SB} + \underline{Z}_{1L}$ with the local source impedances $\underline{Z}_{1SA}$ and $\underline{Z}_{1SB}$ at the respective relays, $\underline{K}_1 = -\underline{Z}_{1L}$, $\underline{L}_1 = \underline{Z}_{1SB} + \underline{Z}_{1L}$ and $\underline{a}_{F1}, \underline{a}_{F2}$ are share coefficients, dependent on fault type according to Table 5.

TABLE 5

Share coefficients from equation (31)

| Fault type | $a_{F1}$ | $a_{F2}$ | $a_{F0}$ |
|---|---|---|---|
| a-g | 0 | 3 | 0 |
| b-g | 0 | 3a | 0 |
| c-g | 0 | $3a^2$ | 0 |
| a-b | 0 | $1-a$ | 0 |
| b-c | 0 | $a-a^2$ | 0 |
| c-a | 0 | $a^2-1$ | 0 |
| a-b-g | $1-a^2$ | $1-a$ | 0 |
| a-b-c-g, a-b-c | | | |
| b-c-g | $a^2-a$ | $a-a^2$ | 0 |
| c-a-g | $a-1$ | $a^2-1$ | 0 |

$a = \exp(j2/3), j = \sqrt{-1}$

In equation (31) the fault current distribution factor $\underline{k}_F$ is derived for the single line case by avoiding zero sequence quantities. It is also taken into account that the positive and negative sequence impedances of the transmission network are identical.

The fault current distribution factor $\underline{k}_F$ according to equation (31) can be further written in the form:

$$\underline{k}_F(d) = \frac{l_{relay}}{\underline{h}_1 \Delta \underline{I}_{A1} + \underline{h}_2 \underline{I}_{A2}} q(d), \qquad (32)$$

where:

$\underline{h}_1 = \underline{a}_{F1}\underline{M}_1 = \underline{a}_{F1}(\underline{Z}_{1SA} + \underline{Z}_{1SB} + \underline{Z}_{1L})$, $\underline{h}_2 = \underline{a}_{F2}\underline{M}_1 = \underline{a}_{F2}(\underline{Z}_{1SB} + \underline{Z}_{1SB} + \underline{Z}_{1L})$ and $\underline{q}(d) = \underline{K}_1 d + \underline{L}_1 = -\underline{Z}_{1L}d + \underline{Z}_{1SB} + \underline{Z}_{1L}$.

In order to calculate the required adaptive shift $\Delta \underline{Z}$ from equation (17) with taking into account equations (30) and (32), the impedance parameters of the network are required to be known. For this purpose the relay A measures the local source impedance $\underline{Z}_{1SA}$ while information on the remote source impedance $\underline{Z}_{1SB}$ is taken from the memory of relay A which is updated after each line fault by sending the actual measured remote source impedance value $\underline{Z}_{1SB}$ via the communication channel. The coefficient q(d) is dependent on the distance to fault d, which in fact is unknown, and therefore the three specific values of the distance corresponding to the beginning with $d_i=0$, the middle with $d_i=0.425$ p.u. and the end with $d_i=0.85$ p.u. of the first zone of the distance protection are substituted. Afterwards it is verified, which one of them is closest to the reality. As a result of that the fault current distribution factor is expressed as:

$$\underline{k}_F(d_i) = \frac{l_{relay}}{\underline{h}_1 \Delta \underline{I}_{A1} + \underline{h}_2 \underline{I}_{A2}} q(d_i), \qquad (33)$$

where:

$d_i=0$ or $d_i=0.425$ p.u. or $d_i=0.85$ p.u.

Therefore, there are three specific shifts of the impedance characteristic $\Delta \underline{Z}_i$ which are considered and finally, after certain checking, one of them is utilized.

Use of the proposed method assures adaptation of the impedance characteristic of the distance relay to the actual fault conditions and as a result of that the relay operation improvement.

The invention claimed is:

1. A method for compensating for a remote line end infeed effect in a distance protection relay during determination of a distance (d) to a resistive fault on a three-phase power transmission line, where a fault current ($\underline{I}_F$) flows through the fault resistance ($R_F$), the method comprising:

calculating a fault loop impedance ($\underline{Z}_{relay}$) by dividing a fault loop voltage ($\underline{V}_{relay}$) by a fault loop current ($\underline{I}_{relay}$) measured from one end (A) of the transmission line, where the fault loop voltage ($\underline{V}_{relay}$) is composed of the respective phase voltages ($\underline{V}_{ph1}, \underline{V}_{ph2}, \underline{V}_{ph3}$) and the fault loop current ($\underline{I}_{relay}$) is composed of the respective phase currents ($\underline{I}_{ph1}, \underline{I}_{ph2}, \underline{I}_{ph3}$) of those phases which are involved in the fault, determining a shift of the fault loop impedance ($\Delta \underline{Z}$), determining the distance to fault (d) by shifting the fault loop impedance ($\underline{Z}_{relay}$) by the determined shift ($\Delta \underline{Z}$), determining the shift of the fault loop impedance ($\Delta \underline{Z}$) from the fault loop impedance ($\underline{Z}_{relay}$), the impedance of the transmission line for the positive current sequence ($\underline{Z}_{1L}$) and the phase angle ($\gamma$) of a complex fault current distribution factor ($\underline{k}_F$), according to the equation $$\Delta \underline{Z} = \frac{R_{relay} X_{1L} - R_{1L} X_{relay}}{R_{1L} tg(\gamma) + X_{1L}} (1 - j \cdot tg(\gamma)),$$

where $\underline{Z}_{relay} = R_{relay} + jX_{relay}$, $\underline{Z}_{1L} = R_{1L} + jX_{1L}$ and where the fault current distribution factor ($\underline{k}_F$) is the ratio of the fault loop current ($\underline{I}_{relay}$) to the fault current ($\underline{I}_F$), calculating the phase angle ($\gamma$) of the complex fault current distribution factor ($\underline{k}_F$), either from the fault loop current ($\underline{I}_{relay}$) and the fault current ($\underline{I}_F$), where the fault current ($\underline{I}_F$) is determined from currents measured synchronously at both ends (A and B) of the transmission line, where in case of a phase-to-ground, a phase-to-phase or a three-phase-balanced fault the fault current ($\underline{I}_F$) is determined using the incremental positive sequence current components ($\Delta \underline{I}_{A1}$, $\Delta \underline{I}_{B1}$) of both ends (A and B) of the transmission line, or in case of a phase-to-phase-to-ground fault the fault current ($\underline{I}_F$) is determined using the incremental positive sequence current components ($\Delta \underline{I}_{A1}$, $\Delta \underline{I}_{B1}$) as well as the negative sequence current components ($\underline{I}_{A2}$, $\underline{I}_{B2}$) of both ends (A, B) of the transmission line, or from the fault loop current ($\underline{I}_{relay}$) and the fault current ($\underline{I}_F$) for three different, predetermined line distances ($d_i$), where the fault current ($\underline{I}_F$) is determined in case of a phase-to-ground or a phase-to-phase fault using impedance parameters ($\underline{Z}_{1L}$, $\underline{Z}_{1SA}$, $\underline{Z}_{1SB}$) of the transmission line, the fault loop current ($\underline{I}_{relay}$) and the negative sequence current component of the one end (A) of the transmission line ($\underline{I}_{A2}$), or in case of a three-phase or a phase-to-phase-to-ground fault using impedance parameters ($\underline{Z}_{1L}$, $\underline{Z}_{1SA}$, $\underline{Z}_{1SB}$) of the transmission line, the fault loop current ($\underline{I}_{relay}$), the negative sequence current component of the one end (A) of the transmission line ($\underline{I}_{A2}$) and the incremental positive sequence current component of the one end (A) of the transmission line ($\Delta \underline{I}_{A1}$), utilizing the three resulting phase angles ($\gamma_i$) to determine three impedance shifts ($\Delta \underline{Z}_i$) and three corresponding possible distances to fault ($d_{pi}$), where the one of the three possible distances to fault ($d_{pi}$) which lies closest to a reference distance to fault ($d_{ref}$), which is calculated as the quotient of the fault loop impedance ($\underline{Z}_{relay}$) and the impedance of the transmission line for the positive current sequence ($\underline{Z}_{1L}$), is chosen as the distance to fault (d), and determining the distance to fault (d) by subtracting the impedance shift ($\Delta \underline{Z}$) from the fault loop impedance ($\underline{Z}_{relay}$) and dividing the result by the impedance of the transmission line for the positive current sequence ($\underline{Z}_{1L}$).

2. The method according to claim 1, where in case that the fault current ($\underline{I}_F$) is determined from currents measured synchronously at both ends (A and B) of the transmission line, the fault current ($\underline{I}_F$) is determined in case of a phase-to-ground, a phase-to-phase or a three-phase-balanced fault from the product of a first share coefficient ($\underline{a}_{F1}$) with the sum of the incremental positive sequence current components ($\Delta \underline{I}_{A1}$, $\Delta \underline{I}_{B1}$), where the value of the first share coefficient ($\underline{a}_{F1}$) depends on the phase or phases which are involved in the fault, or in case of a phase-to-phase-to-ground fault from the sum of two products, where one of the two products is a first share coefficient ($\underline{a}_{F1}$) multiplied with the sum of the incremental positive sequence current components ($\Delta \underline{I}_{A1}$, $\Delta \underline{I}_{B1}$) and where the other of the two products is a second share coefficient ($\underline{a}_{F2}$) multiplied with the sum of the negative sequence current components ($\underline{I}_{A2}$, $\underline{I}_{B2}$), where the values of the first and the second share coefficients ($\underline{a}_{F1}$, $\underline{a}_{F2}$) depend on the phases which are involved in the fault.

3. The method according to claim 1, where in case that the fault current ($\underline{I}_F$) is determined for three different, predetermined line distances ($d_i$), the fault current ($\underline{I}_F$) is determined in case of a phase-to-ground or a phase-to-phase fault using the equation $$I_F(d_i) = \frac{\underline{a}_{F2} \cdot (\underline{Z}_{1SA} + \underline{Z}_{1SB} + \underline{Z}_{1L}) \cdot I_{A2}}{(-\underline{Z}_{1L} \cdot d_i + \underline{Z}_{1SB} + \underline{Z}_{1L})} \text{ or}$$

in case of a three-phase or a phase-to-phase-to-ground fault using the equation $$I_F(d_i) = \frac{\underline{a}_{F1} \cdot (\underline{Z}_{1SA} + \underline{Z}_{1SB} + \underline{Z}_{1L}) \cdot \Delta I_{A1} + \underline{a}_{F2} \cdot (\underline{Z}_{1SA} + \underline{Z}_{1SB} + \underline{Z}_{1L}) \cdot I_{A2}}{(-\underline{Z}_{1L} \cdot d_i + \underline{Z}_{1SB} + \underline{Z}_{1L})},$$

where the values of the first and the second share coefficients $\underline{a}_{F1}$ and $\underline{a}_{F2}$ depend on the phases which are involved in the fault, $\underline{Z}_{1L}$ is the impedance of the transmission line for the positive current sequence $\underline{Z}_{1SA}$ is the local source impedance at the one end (A) of the transmission line, $\underline{Z}_{1SB}$ is the remote source impedance at the other end (B) of the transmission line.

4. The method according to claim 1, wherein the remote source impedance value ($\underline{Z}_{1SB}$) is transmitted to the one end (A) of the transmission line via a communication channel.

5. An adaptive distance protection relay, comprising:

means for performing a method for compensating for a remote line end infeed effect in a distance protection relay during determination of a distance (d) to a resistive fault on a three-phase power transmission line, where a fault current ($\underline{I}_F$) flows through the fault resistance ($R_F$), the method comprising:

calculating a fault loop impedance ($\underline{Z}_{relay}$) by dividing a fault loop voltage ($\underline{V}_{relay}$) by a fault loop current ($\underline{I}_{relay}$) measured from one end (A) of the transmission line, where the fault loop voltage ($\underline{V}_{relay}$) is composed of the respective phase voltages ($\underline{V}_{ph1}$, $\underline{V}_{ph2}$, $\underline{V}_{ph3}$) and the fault loop current ($\underline{I}_{relay}$) is composed of the respective phase currents ($\underline{I}_{ph1}$, $\underline{I}_{ph2}$, $\underline{I}_{ph3}$) of those phases which are involved in the fault, determining a shift of the fault loop impedance ($\Delta Z$), determining the distance to fault (d) by shifting the fault loop impedance ($\underline{Z}_{relay}$) by the determined shift ($\Delta Z$), determining the shift of the fault loop impedance (ΔZ) from the fault loop impedance ($\underline{Z}_{relay}$), the impedance of the transmission line for the positive current sequence ($\underline{Z}_{1L}$) and the phase angle (γ) of a complex fault current distribution factor ($\underline{k}_F$), according to the equation $$\Delta \underline{Z} = \frac{R_{relay}X_{1L} - R_{1L}X_{relay}}{R_{1L}tg(\gamma) + X_{1L}}(1 - j \cdot tg(\gamma)),$$

where $\underline{Z}_{relay} = R_{relay} + jX_{relay}$, $\underline{Z}_{1L} = R_{1L} + jX_{1L}$ and where the fault current distribution factor ($\underline{k}_F$) is the ratio of the fault loop current ($\underline{I}_{relay}$) to the fault current ($\underline{I}_F$), calculating the phase angle (γ) of the complex fault current distribution factor ($\underline{k}_F$),
either from the fault loop current ($\underline{I}_{relay}$) and the fault current ($\underline{I}_F$), where the fault current ($\underline{I}_F$) is determined from currents measured synchronously at both ends (A and B) of the transmission line, where
in case of a phase-to-ground, a phase-to-phase or a three-phase-balanced fault the fault current ($\underline{I}_F$) is determined using the incremental positive sequence current components ($\Delta\underline{I}_{A1}$, $\Delta\underline{I}_{B1}$) of both ends (A and B) of the transmission line, or
in case of a phase-to-phase-to-ground fault the fault current ($\underline{I}_F$) is determined using the incremental positive sequence current components ($\Delta\underline{I}_{A1}$, $\Delta\underline{I}_{B1}$) as well as the negative sequence current components ($\underline{I}_{A2}$, $\underline{I}_{B2}$) of both ends (A, B) of the transmission line,
or from the fault loop current ($\underline{I}_{relay}$) and the fault current ($\underline{I}_F$) for three different, predetermined line distances ($d_i$), where the fault current ($\underline{I}_F$) is determined
in case of a phase-to-ground or a phase-to-phase fault using impedance parameters ($\underline{Z}_{1L}$, $\underline{Z}_{1SA}$, $\underline{Z}_{1SB}$) of the transmission line, the fault loop current ($\underline{I}_{relay}$) and the negative sequence current component of the one end (A) of the transmission line ($\underline{I}_{A2}$), or
in case of a three-phase or a phase-to-phase-to-ground fault using impedance parameters ($\underline{Z}_{1L}$, $\underline{Z}_{1SA}$, $\underline{Z}_{1SB}$) of the transmission line, the fault loop current ($\underline{I}_{relay}$) the negative sequence current component of the one end (A) of the transmission line ($\underline{I}_{A2}$) and the incremental positive sequence current component of the one end (A) of the transmission line ($\Delta\underline{I}_{A1}$),
utilizing the three resulting phase angles ($γ_i$) to determine three impedance shifts ($\Delta\underline{Z}_i$) and three corresponding possible distances to fault ($d_{pi}$), where the one of the three possible distances to fault ($d_{pi}$) which lies closest to a reference distance to fault ($d_{ref}$), which is calculated as the quotient of the fault loop impedance ($\underline{Z}_{relay}$) and the impedance of the transmission line for the positive current sequence ($\underline{Z}_{1L}$), is chosen as the distance to fault (d), and
determining the distance to fault (d) by subtracting the impedance shift (ΔZ) from the fault loop impedance ($\underline{Z}_{relay}$) and dividing the result by the impedance of the transmission line for the positive current sequence ($\underline{Z}_{1L}$).

6. A computer program product, comprising:
a non-transitory computer readable medium; and
computer program instructions recorded on the computer readable medium and executable by a processor for carrying out a method for compensating for a remote line end infeed effect in a distance protection relay during determination of a distance (d) to a resistive fault on a three-phase power transmission line, where a fault current ($\underline{I}_F$) flows through the fault resistance ($R_F$), the method comprising:

calculating a fault loop impedance ($\underline{Z}_{relay}$) by dividing a fault loop voltage ($\underline{V}_{relay}$) by a fault loop current ($\underline{I}_{relay}$) measured from one end (A) of the transmission line, where the fault loop voltage ($\underline{V}_{relay}$) is composed of the respective phase voltages ($\underline{V}_{ph1}$, $\underline{V}_{ph2}$, $\underline{V}_{ph3}$) and the fault loop current ($\underline{I}_{relay}$) is composed of the respective phase currents ($\underline{I}_{ph1}$, $\underline{I}_{ph2}$, $\underline{I}_{ph3}$) of those phases which are involved in the fault,
determining a shift of the fault loop impedance (ΔZ),
determining the distance to fault (d) by shifting the fault loop impedance ($\underline{Z}_{relay}$) by the determined shift (ΔZ),
determining the shift of the fault loop impedance (ΔZ) from the fault loop impedance ($\underline{Z}_{relay}$), the impedance of the transmission line for the positive current sequence ($\underline{Z}_{1L}$) and the phase angle (γ) of a complex fault current distribution factor ($\underline{k}_F$), according to the equation $$\Delta \underline{Z} = \frac{R_{relay}X_{1L} - R_{1L}X_{relay}}{R_{1L}tg(\gamma) + X_{1L}}(1 - j \cdot tg(\gamma)),$$

where $\underline{Z}_{relay} = R_{relay} + jX_{relay}$, $\underline{Z}_{1L} = R_{1L} + jX_{1L}$ and where the fault current distribution factor ($\underline{k}_F$) is the ratio of the fault loop current ($\underline{I}_{relay}$) to the fault current ($\underline{I}_F$), calculating the phase angle (γ) of the complex fault current distribution factor ($\underline{k}_F$),
either from the fault loop current ($\underline{I}_{relay}$) and the fault current ($\underline{I}_F$), where the fault current ($\underline{I}_F$) is determined from currents measured synchronously at both ends (A and B) of the transmission line, where
in case of a phase-to-ground, a phase-to-phase or a three-phase-balanced fault the fault current ($\underline{I}_F$) is determined using the incremental positive sequence current components ($\Delta\underline{I}_{A1}$, $\Delta\underline{I}_{B1}$) of both ends (A and B) of the transmission line, or
in case of a phase-to-phase-to-ground fault the fault current ($\underline{I}_F$) is determined using the incremental positive sequence current components ($\Delta\underline{I}_{A1}$, $\Delta\underline{I}_{B1}$) as well as the negative sequence current components ($\underline{I}_{A2}$, $\underline{I}_{B2}$) of both ends (A, B) of the transmission line,
or from the fault loop current ($\underline{I}_{relay}$) and the fault current ($\underline{I}_F$) for three different, predetermined line distances ($d_i$), where the fault current ($\underline{I}_F$) is determined
in case of a phase-to-ground or a phase-to-phase fault using impedance parameters ($\underline{Z}_{1L}$, $\underline{Z}_{1SA}$, $\underline{Z}_{1SB}$) of the transmission line, the fault loop current ($\underline{I}_{relay}$) and the negative sequence current component of the one end (A) of the transmission line ($\underline{I}_{A2}$), or
in case of a three-phase or a phase-to-phase-to-ground fault using impedance parameters ($\underline{Z}_{1L}$, $\underline{Z}_{1SA}$, $\underline{Z}_{1SB}$) of the transmission line, the fault loop current ($\underline{I}_{relay}$), the negative sequence current component of the one end (A) of the transmission line ($\underline{I}_{A2}$) and the incremental positive sequence current component of the one end (A) of the transmission line ($\Delta\underline{I}_{A1}$),
utilizing the three resulting phase angles ($γ_i$) to determine three impedance shifts ($\Delta\underline{Z}_i$) and three corresponding possible distances to fault ($d_{pi}$), where the one of the three possible distances to fault ($d_{pi}$) which lies closest to a reference distance to fault ($d_{ref}$), which is calculated as the quotient of the fault loop impedance ($\underline{Z}_{relay}$) and the impedance of the transmission line for the positive current sequence ($\underline{Z}_{1L}$), is chosen as the distance to fault (d), and determining the distance to fault (d) by subtracting the impedance shift ($\Delta Z$) from the fault loop impedance ($\underline{Z}_{relay}$) and dividing the result by the impedance of the transmission line for the positive current sequence ($\underline{Z}_{1L}$).

* * * * *